(12) United States Patent
Lim et al.

(10) Patent No.: US 8,193,081 B2
(45) Date of Patent: Jun. 5, 2012

(54) METHOD AND SYSTEM FOR METAL GATE FORMATION WITH WIDER METAL GATE FILL MARGIN

(75) Inventors: Peng-Soon Lim, Johor (MY); Meng-Hsuan Chan, Taipei (TW); Kuang-Yuan Hsu, Fongyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 108 days.

(21) Appl. No.: 12/582,031

(22) Filed: Oct. 20, 2009

(65) Prior Publication Data
US 2011/0089484 A1   Apr. 21, 2011

(51) Int. Cl.
*H01L 21/283* (2006.01)
(52) U.S. Cl. ........ 438/589; 438/584; 438/702; 257/330; 257/E21.41; 257/E21.159
(58) Field of Classification Search ............... 438/584, 438/589, 702; 257/330
See application file for complete search history.

(56) References Cited

U.S. PATENT DOCUMENTS

| 5,323,040 | A  | * | 6/1994  | Baliga ............................. 257/332 |
| 6,376,888 | B1 | * | 4/2002  | Tsunashima et al. ......... 257/407 |
| 2005/0275042 | A1 | * | 12/2005 | Hwang et al. .................. 257/401 |
| 2008/0153216 | A1 | * | 6/2008  | Kumar et al. .................. 438/173 |
| 2008/0185637 | A1 | * | 8/2008  | Nagaoka et al. ............... 257/327 |
| 2009/0026626 | A1 | * | 1/2009  | Matsuyama et al. ........... 257/770 |
| 2009/0166749 | A1 | * | 7/2009  | Ichihara et al. ................ 257/369 |
| 2010/0059814 | A1 | * | 3/2010  | Loechelt et al. ............... 257/330 |
| 2011/0008940 | A1 | * | 1/2011  | Fung .............................. 438/270 |

FOREIGN PATENT DOCUMENTS

| KR | 2008-11491  | * | 2/2008 |
| KR | 2009-100080 | * | 9/2009 |

* cited by examiner

*Primary Examiner* — A. Sefer
(74) *Attorney, Agent, or Firm* — Haynes and Boone, LLP

(57) ABSTRACT

A method includes providing a semiconductor substrate having a gate trench and depositing a metal layer, using a physical vapor deposition (PVD) process, over the substrate to partially fill the trench. The metal layer includes a bottom portion and a sidewall portion that is thinner than the bottom portion. The method also includes forming a coating layer on the metal layer, etching back the coating layer such that a portion of the coating layer protects a portion of the metal layer within the trench, and removing the unprotected portion of the metal layer. A different aspect involves a semiconductor device that includes a gate that includes a trench having a top surface, and a metal layer formed over the trench, wherein the metal layer includes a sidewall portion and a bottom portion, and wherein the sidewall portion is thinner than the bottom portion.

20 Claims, 7 Drawing Sheets

METHOD AND SYSTEM FOR METAL GATE FORMATION WITH WIDER METAL GATE FILL MARGIN

BACKGROUND

This disclosure relates in general to a semiconductor device, and more particularly to a gate structure and method of forming a gate structure of a semiconductor device. Atomic layer deposition (ALD) and chemical vapor deposition (CVD) are two conventional technologies that have been used to form metal gate structures. However, after the metal layer is formed using the foregoing technologies, the pFET/nFET aperture may be narrow as a result of thick sidewalls formed during deposition of the metal layer.

During pFET processing, the narrow aperture can affect subsequent flow of metal-fill into the aperture. As the size of the semiconductor device decreases, the narrow width of the aperture becomes more of an issue (e.g., devices scaled below N28). Furthermore, with respect to nFET processing, once the metal layer has been formed, it may be desirable to remove a portion of the metal layer from the nFET. However, the aperture may be too narrow to allow efficient flow of metal removal solution therethrough. Thus, because of the narrow apertures that result from the use of ALD and CVD processes, ALD and CVD have not been satisfactory for the above reasons.

Physical vapor deposition (PVD) is another metal gate formation technology. The parameters of PVD operation may be more finely tuned and controlled (e.g. vertical and horizontal deposition rate), and can facilitate the formation of a metal layer that has an aperture that is larger than the apertures produced using ALD and CVD processes. Another disadvantage of ALD and CVD technologies is that they are conformal to the trench, and thus the thickness of sidewalls and bottom portions of the metal layer cannot be controlled. However, such conditions may be controlled using PVD technology.

Despite the advantages of PVD technology, one unsatisfactory aspect of using PVD technology to form a metal layer is that PVD technology cause the formation of overhang portions along the top surface of the metal layer. The overhang may narrow the top surface of the aperture, thereby obstructing the flow of metal-fill and/or chemical solutions into the aperture. Consequently, conventional PVD techniques for forming a gate are also not satisfactory for the above reasons. Thus, there is a need for improving the gate formation process when using PVD technology.

SUMMARY

One of the broader forms of the invention involves a method of fabricating a semiconductor device. The method includes providing a semiconductor substrate having a gate trench; depositing a metal layer over the substrate to partially fill the trench in a manner such that the metal layer includes a bottom portion and a sidewall portion that is thinner than the bottom portion; forming a protection layer on the metal layer such that a portion of the protection layer protects a portion of the metal layer within the trench; and removing an unprotected portion of the metal layer.

Another one of the broader forms of the invention involves a method that includes providing a semiconductor substrate having a gate trench and depositing a metal layer, using a physical vapor deposition (PVD) process, over the substrate to partially fill the trench. The metal layer includes a bottom portion and a sidewall portion that is thinner than the bottom portion. The method also includes forming a coating layer on the metal layer, etching back the coating layer such that a portion of the coating layer protects a portion of the metal layer within the trench, and removing the unprotected portion of the metal layer.

Yet another of the broader forms of the invention involves a semiconductor device that includes a gate that includes a trench having a top surface, and a metal layer formed over the trench, wherein the metal layer includes a sidewall portion and a bottom portion, and wherein the sidewall portion is thinner than the bottom portion.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
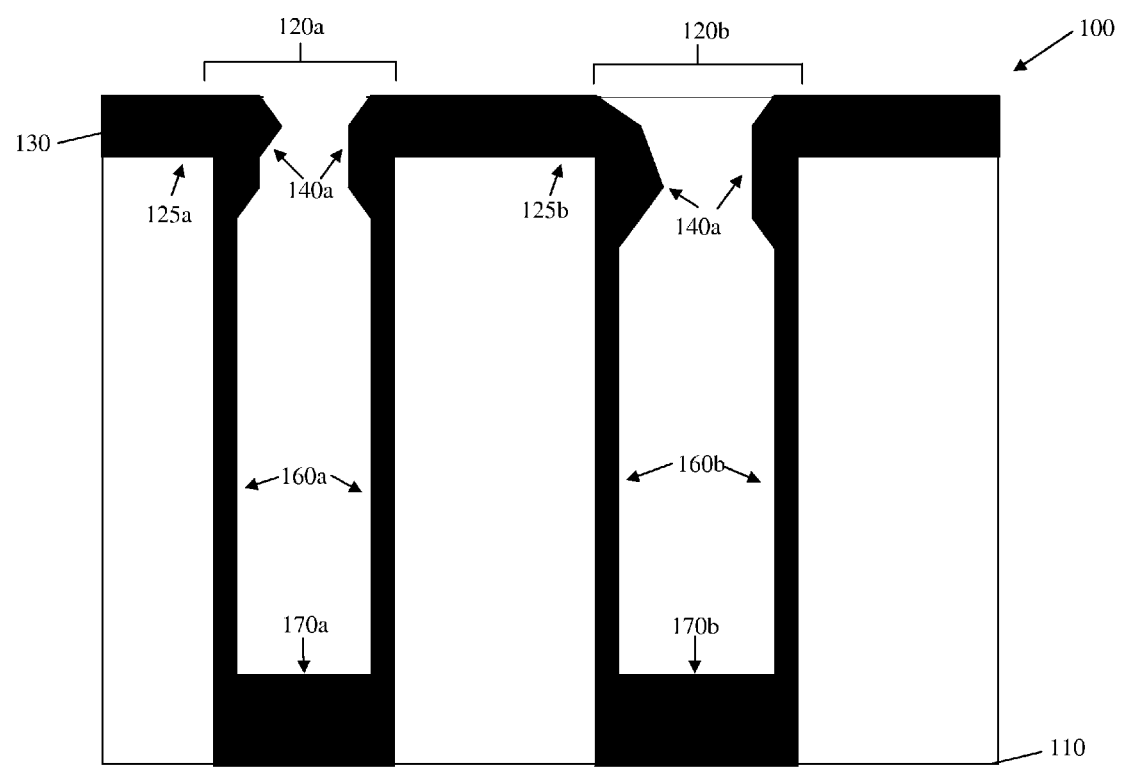
FIGS. 1-5a are cross-sectional views of a semiconductor device at various stages of fabrication in an embodiment of a gate last process.

The present disclosure relates generally to forming an integrated circuit device on a substrate, and more particularly, to fabricating a gate structure as part of an integrated circuit (including FET devices). It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. In addition, the present disclosure provides examples of a "gate last" metal gate process, however one skilled in the art may recognize applicability to other processes and/or use of other materials.

Referring to FIGS. 1-5a, illustrated are cross-sectional views of a semiconductor device at various stages of fabrication in a gate last process. In each of FIGS. 1-5a, similar features are numbered using the same reference numeral for the sake of simplicity and clarity. The various stages of the device are illustrated as device 100, 200, 300, 400, 500, and 600, respectively. The devices 100, 200, 300, 400, 500, and 600 may be intermediate devices fabricated during processing of an integrated circuit, or portion thereof, that may comprise static random access memory (SRAM) and/or other logic circuits, passive components such as resistors, capacitors, and inductors, and active components such as P-channel field effect transistors (pFET), N-channel FET (nFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

Referring now to FIG. 1, a cross-section of a semiconductor device 100 is shown. The semiconductor device 100 includes a substrate 110. Formed on the substrate 110 are gate trenches 120*a-b*. The trenches 120*a-b* have top surfaces 125*a-b*, respectively. The gate trenches 120*a-b* may be formed in a "gate last" or "gate replacement" process. In a gate last process, dummy polysilicon gate structures are formed and continues with processing to form various features of the transistors until deposition of an inter-layer dielectric (ILD). The dummy poly gate structures are then removed thereby forming the gate trenches 120*a-b*.

In an embodiment, the substrate 110 includes a silicon substrate (e.g., wafer) in crystalline structure. The substrate 110 may include various doping configurations depending on design requirements as is known in the art (e.g., p-type substrate or n-type substrate). Other examples of the substrate 110 may also include other elementary semiconductors such as germanium and diamond. Alternatively, the substrate 110 may include a compound semiconductor such as, silicon carbide, gallium arsenide, indium arsenide, or indium phosphide. Further, the substrate 110 may optionally include an epitaxial layer (epi layer), may be strained for performance enhancement, and/or may include a silicon-on-insulator (SOI) structure.

A metal layer 130 is formed on the trenches 120*a-b*. The metal layer 130 is deposited using a PVD process over the substrate 110 to partially fill the trenches 120*a-b*. The metal layer 130 may include one or more layers of material, such as, liners, materials to provide appropriate work function of the gate, gate electrode materials, and/or other suitable materials. For example, in one exemplary embodiment, the metal layer 130 includes titanium nitride (TiN). Alternatively, the metal layer 130 may include other metals, such as titanium (Ti), tantalum nitride (TaN), tungsten nitride (WN), ruthenium (Ru), and aluminum (Al).

It has been observed that deposition of one or more layers required for the metal layer 130 formation may provide incomplete filling of the trenches 120*a-b*. For example, a deposition of a the metal layer 130 via PVD may produce overhangs 140*a-b* along the top surfaces 125*a-b* of the trenches 120*a-b*, respectively. The overhangs 140*a-b* may result from the difficulties in filling in a high aspect ratio trench.

The metal layer 130 includes sidewall portions 160*a-b*, and a bottom portions 170*a-b*, respectively. Deposition of the metal layer 130 via PVD is customized so that the resulting sidewall portions 160*a-b* are thinner than the bottom portions 170*a-b*. For example, in an embodiment, the PVD process for semiconductor device 100 is carried out at a pressure that is less than approximately 100 mT. Substrate bias may be either on or off. Typical front-end process power may be used so that dielectric materials in the semiconductor device 100 are not damaged. In other embodiments, other appropriate PVD parameters may be used. In an embodiment, the sidewall portions 160*a-b* are at least approximately 33% thinner than the bottom portions 170*a-b*.

Figure 2:
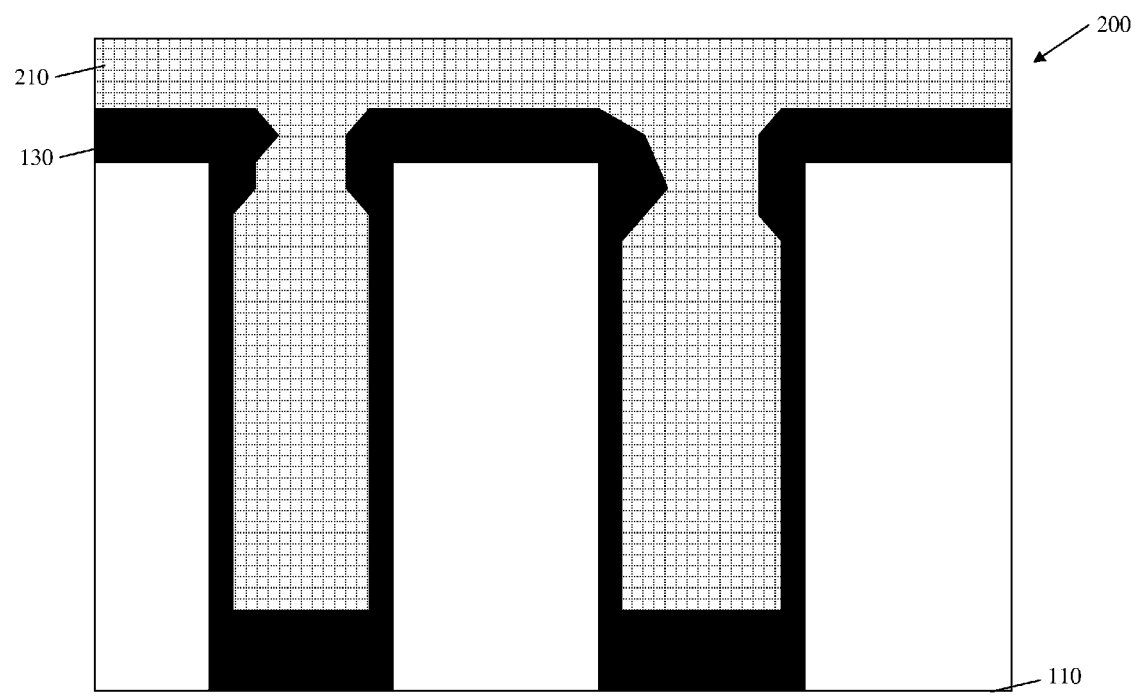

Referring now to FIG. 2, illustrated is a cross-section of a semiconductor device 200. The semiconductor device 200 includes the same features as the semiconductor device 100, except that the semiconductor device 200 also includes a coating layer 210 that is formed over the metal layer 130. The coating layer 210 may be formed on the metal layer 130 by a spin-coating process. Formation of the coating layer 210 may include soft baking the coating layer 210. The coating layer 210 includes DUV light-absorbing oxide (DUO). However, in other exemplary embodiments, the coating layer 210 may include one or more layers of materials, including without limitation, spin-on-dielectric (SOD).

In an exemplary embodiment, upon forming the coating layer 210, the semiconductor device 200 may be pre-baked at a temperature of approximately 110° C. to approximately 200° C. for less than approximately two minutes. However, other pre-bake temperatures and times are also possible. After pre-baking, the semiconductor device 200 may be baked at a temperature of approximately 170° C. to approximately 300° C. for less than approximately two minutes. However, other bake times may also be used.

Figure 3:
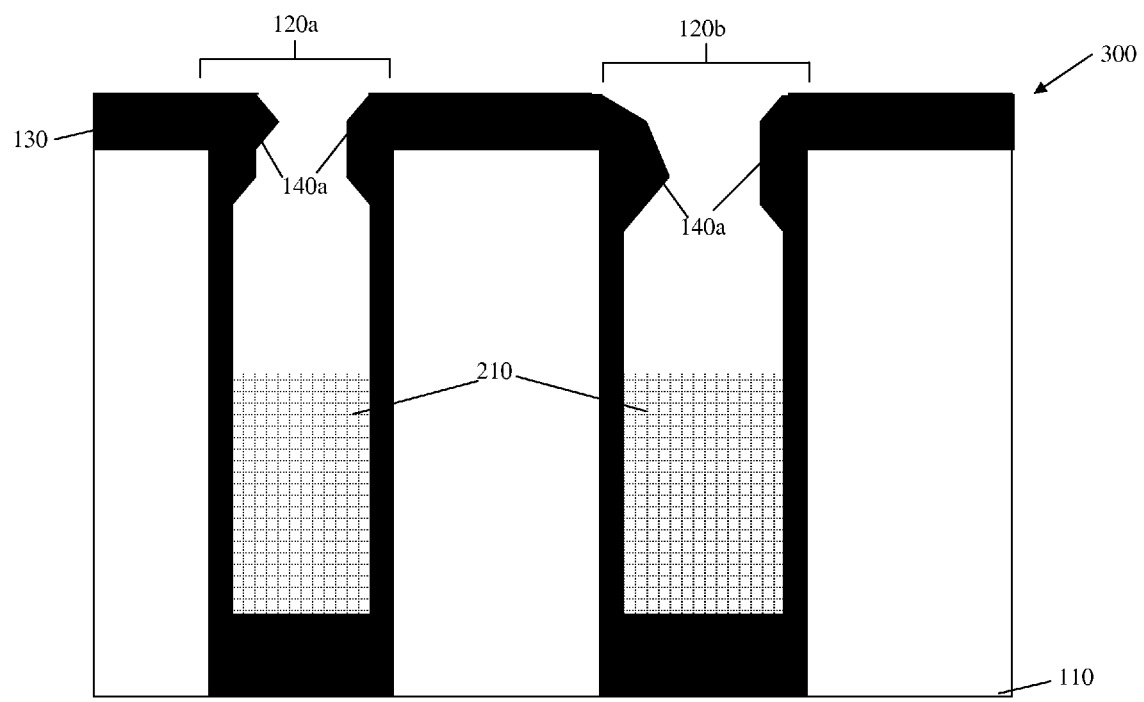

Referring now to FIG. 3, illustrated is a cross-section of a semiconductor device 300. The semiconductor device 300 includes the same features as the semiconductor device 200, except that the coating layer 210 is etched back, such that a portion of the coating layer 210 protects a portion of the metal layer 130 within the trenches 120*a-b*. The coating layer 210 may be etched back using any conventional process known in the art. In an embodiment, the coating layer 210 is wet-etched using a fluoride (F)-based solution. The wet etching process is performed at any temperature between about 20 degrees Celsius and about 80 degrees Celsius. In another embodiment, the coating layer 210 is dry-etched using a fluoride (F)-based plasma. In yet another embodiment, the removal etch solution may be a TMAH-based solution, an HF-based solutions, and/or other suitable materials. That is, removal of the coating layer 210 may be performed using a TMAH-based solution, an F-based solution, an F-based plasma, and/or other suitable materials. After etching back the coating layer 210, the top surface of the remaining portion of the coating layer 210 is below the top surfaces 125*a-b* of the trenches 120*a-b*.

The coating layer 210 may be etched to any height. In an exemplary embodiment, the coating layer 210 is etched back to a height that is below the top surfaces 125*a-b* of the trenches 120*a-b*, depending on the subsequent process. If the coating layer 210 is etched to a point that is too high with respect to the top surfaces 125*a-b* of the trenches 120*a-b*, then the overhang portions 140*a-b* will remain after a subsequent metal layer 130 etch back process described below. However, if the coating layer 210 is etched to a point that is too low with respect to the top surfaces 125*a-b* of the trenches 120*a-b*, a subsequent process may damage the substrate 110.

Figure 4:
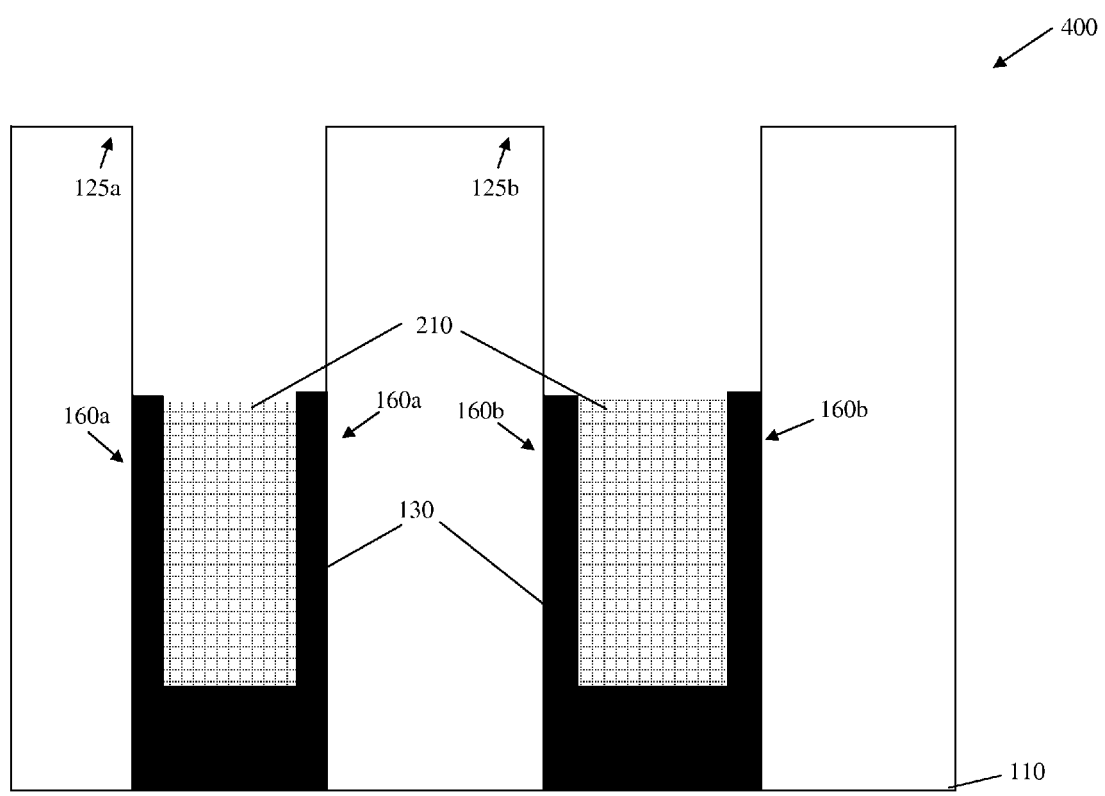

Referring now to FIG. 4, illustrated is a cross-section of a semiconductor device 400. The semiconductor device 400 includes the same features as the semiconductor device 300, except that the unprotected portion of the metal layer 130 is removed, thereby leaving the portion of the metal layer 130 that is protected by the remaining portion of the coating layer 210. In the semiconductor device 400, upon removal of the unprotected portion of the metal layer 130, the top surface of the metal layer 130 is completely removed, and a first portion of the sidewall portions 160*a-b* of the metal layer 130 is removed so that a second portion of the sidewall portions 160*a-b* that is below the top surfaces 125*a-b* of the trenches 120*a-b* remains. As a result of removing the unprotected portion of the metal layer 130, the overhang 140*a-b* is also removed thereby opening the trenches 120*a-b* for subsequent processing. In the semiconductor device 400, an SC1-based, H2SO4-based, HNO3-based, or H3PO4-based solution may be used to remove the unprotected portion of the metal layer 130. The wet-etch process is performed at any temperature between about 25 degrees Celsius to about 80 degrees Celsius.

In another embodiment, the top surface of the metal layer 130 is not completely removed. For example, in an embodiment, there is no etch back of the metal layer 130. In such an embodiment, the top surface of the metal layer 130 remains untouched, thereby leaving the overhang 140*a-b*. In another embodiment, the top surface of the metal layer 130 remains, but only a portion of the overhang 140*a-b* is removed.

Figure 5:
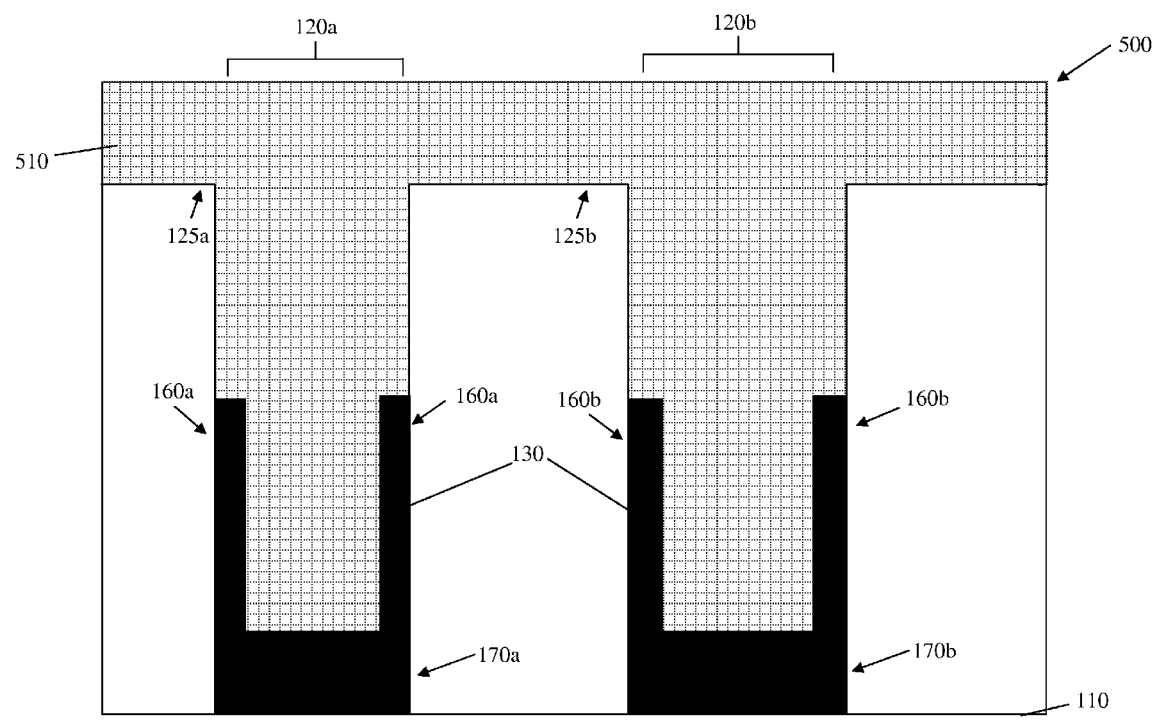

Referring now to FIG. 5, illustrated is a cross-section of a semiconductor device 500. The semiconductor device 500 includes the same features as the semiconductor device 400, except that a second coating layer 510 is formed on the metal layer 130 refilling the trenches 120*a-b*. In some embodiments, the portion of the coating layer 210 can remain within the trenches 120*a-b* prior to refilling with the coating layer 510. In other embodiments, the portion of the coating layer 210 can be removed prior to refilling with the coating layer 510. The second coating layer 510 is formed by a spin-coating process, and completely fills the trenches 120*a*-120*b*. The second coating layer 510 includes DUO. However, in other exemplary embodiments, the second coating layer 510 may include one or more layers of materials, including without limitation, spin-on-dielectric (SOD), TMAH-based solutions, HF-based solutions, and/or other suitable materials.

The semiconductor device 500 has a metal layer 130 that has sidewall portions 160*a-b* that are (a) below the top surfaces 125*a-b* of the trenches 120*a-b*, and (b) thinner than the bottom portions 170*a-b*. A metal patterning process such as photolithography may then be performed on the semiconductor device 500. For example, in an embodiment, trench 120*a* is designated as a pFET and trench 120*b* is designated as an nFET. The metal layer 130 may include a p-type work function metal layer (p-metal). Accordingly, the patterning process patterns the coating layer 510 to protect the p-metal layer in the trench 120*a* (pFET) but not the p-metal layer in the trench 120*b* (nFET). The p-metal layer in the trench 120*b* (nFET) may be removed by an dry etching or wet etching process. It should be noted that the absence of the overhang allows the etchant to easily fill the trench 120*b* and remove the p-metal layer. An n-type work function metal (n-metal) layer may be formed in the trench 120*b* (nFET). A chemical mechanical polishing may be utilized to remove the various material layers disposed outside of trenches 120*a-b*.

Figure 5A:
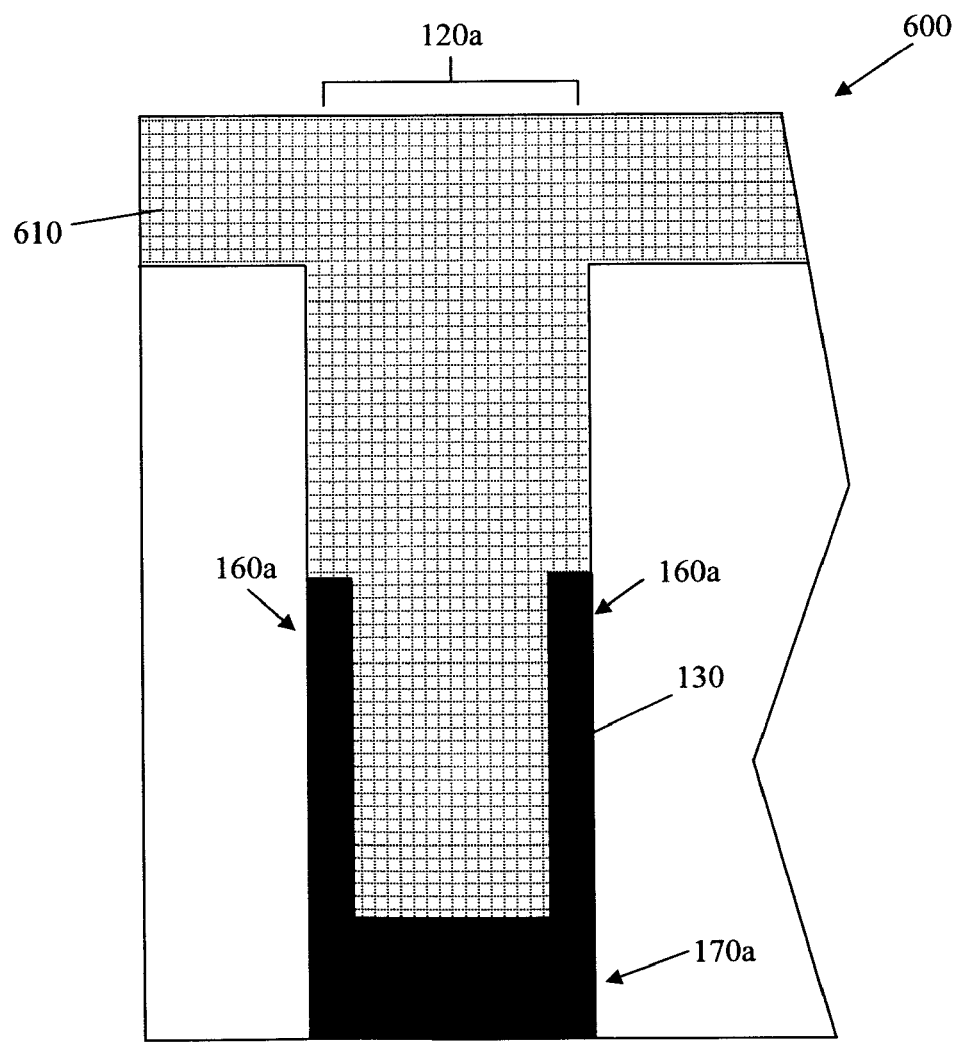

Further, referring to FIG. 5*a*, following the removal of the coating layer 510 in the trench 120*a* (pFET), a conductive layer 610 may be deposited to fill in the remainder of the trenches 120*a-b*. The absence of overhang enables the conductive material layer to completely fill the trenches 120*a-b*. For example, a layer of titanium (Ti), or a Ti-based alloy metal, may be deposited to function as a wetting layer for a subsequent aluminum (Al) fill. The Ti layer may be formed by PVD or other suitable process. A layer of Al may be formed on the wetting layer. Alternatively, the conductive layer may optionally include tungsten (W), copper (Cu), or other suitable metal material. A CMP may to remove the conductive layer disposed outside of the trenches 120*a-b*. The CMP may have a high selectivity to provide a substantially planar surface for the gate structures Accordingly, the metal gate of the nFET may perform the proper n-type work function and the metal gate of the pFET may perform the proper p-type work function. Thus, the desired threshold voltages of the nFET and pFET, respectively, may be achieved without added complexity. It is understood that the semiconductor device 500 may undergo further processing to form various features such as contacts/vias, interconnect metal layers, inter-metal dielectric, passivation layers, etc.

Figure 6:
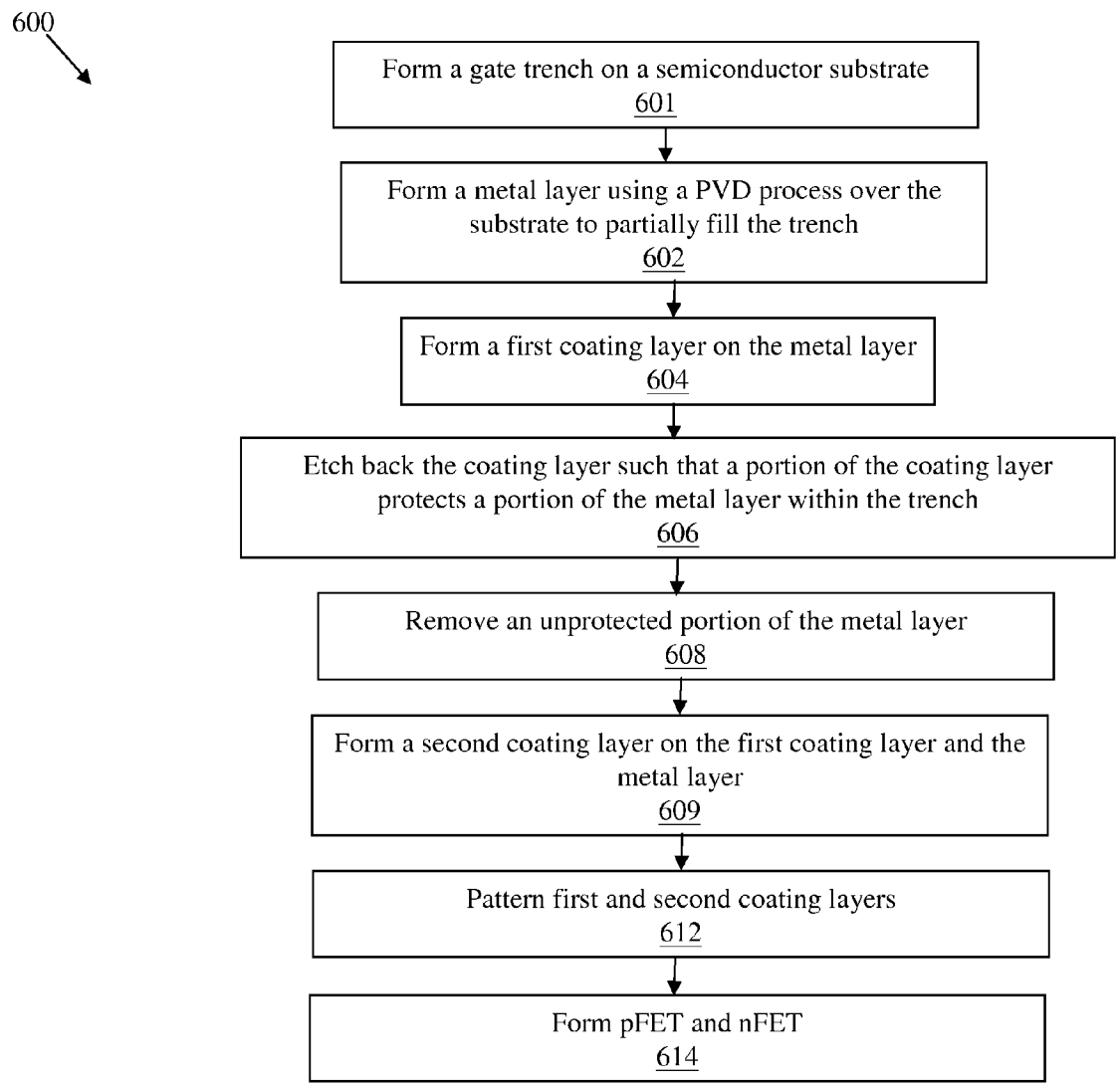
FIG. 6 is a flowchart of an embodiment of a method for forming a gate including a gate last process according to various aspects of the present disclosure.

Referring now to FIG. 6, illustrated is a flowchart of an embodiment of a method 600 for forming a semiconductor device according to various aspects of the present disclosure. The method 600 includes a block 601 that includes forming a gate trench on a semiconductor substrate. At block 602, a metal layer is formed using a PVD process over the substrate, and the metal layer partially fills the trench. Proceeding to block 604, a first coating layer is formed on the metal layer. Further, at block 606, the first coating layer is etched back such that, the remaining portion of the first coating layer protects a portion of the metal layer within the trench. An unprotected portion of the metal layer is removed at a block 608. In an exemplary embodiment, a portion of the overhang is also removed upon removal of the unprotected portion of the metal layer. For example, all of the overhang may be removed. In another exemplary embodiment, removing an unprotected portion of the metal layer at block 608 does not affect any overhang portion of the metal layer. At a step 609, a second coating layer is formed on the first coating layer and the metal layer. Moving to block 612, the first and second coating layers may be patterned as part of one or more processes for forming metal gates of pFET and nFET devices on the semiconductor device. Finally, at block 614, pFET and nFET structures are formed on the semiconductor device.

Exemplary embodiments of a method and system for metal gate formation have been described above. The present disclosure teaches an "SOG" approach for metal gate formation. However, portions of the method and system described above may be applied to one of several traditional approaches for metal gate formation.

Accordingly, the present disclosure provides a device and method that includes a modified trench structure that prevents or reduces the risk of incomplete formation of a metal gate in a gate-last process. While the preceding description shows and describes one or more embodiments, it will be understood by those skilled in the art that various changes in form and detail may be made therein without departing from the spirit and scope of the present disclosure. For example, although the methods implements a "gate last" approach, the methods disclosed herein may be used in a hybrid process in which one type of metal gate is formed in a "gate first" process and the other type of metal gate is formed in a "gate last" process. Further, although a coating material is disclosed herein to protect the bottom metal in the trench, it has been contemplated that other polymeric materials may be used since an exposure process is not required for the etch back process. Therefore, the claims should be interpreted in a broad manner, consistent with the present disclosure.

What is claimed is:

1. A method of fabricating a semiconductor device, comprising:
    providing a semiconductor substrate having a gate trench;
    depositing a metal layer over the substrate to partially fill the trench in a manner such that the metal layer includes a bottom portion and a sidewall portion that is thinner than the bottom portion;
    forming a first protection layer on the metal layer such that a portion of the first protection layer protects a first portion of the metal layer within the trench;
    removing an unprotected portion of the metal layer; and
    thereafter forming a second protection layer on the first protection layer and the metal layer such that a portion of the second protection layer protects a second portion of the metal layer within the trench.

2. The method of claim 1, wherein the unprotected portion of the metal layer includes a overhang that is formed at an opening of the gate trench following the depositing the metal layer.

3. The method of claim 1, wherein the sidewall portion is at least approximately 33% thinner than the bottom portion.

4. The method of claim 1, wherein the depositing the metal layer includes performing a physical vapor deposition (PVD).

5. The method of claim 4, wherein the PVD is performed at a pressure less than approximately 100 mT.

6. The method of claim 1, wherein the first and second protection layers are formed of a same material.

7. A method of fabricating a semiconductor device, comprising:
  providing a semiconductor substrate having a gate trench;
  depositing a metal layer, using a physical vapor deposition (PVD) process, over the substrate to partially fill the trench, wherein the metal layer includes a bottom portion, and a sidewall portion that is thinner than the bottom portion;
  forming a coating layer on the metal layer such that a portion of the coating layer protects a portion of the metal layer within the trench;
  removing an unprotected portion of the metal layer;
  removing the portion of the coating layer from the trench; and
  filling a remainder of the trench with a conductive layer after removing the portion of the coating layer.

8. The method of claim 7, wherein the PVD process is performed at a pressure less than approximately 100 mT.

9. The method of claim 7, wherein removing the unprotected portion of the metal layer includes removing an overhang of the unprotected portion of the metal layer that is formed at an opening of the gate trench upon depositing the metal layer.

10. The method of claim 7, wherein the metal layer includes titanium nitride (TiN).

11. The method of claim 7, wherein forming the coating layer on the metal layer includes etching the coating layer.

12. The method of claim 7, wherein the coating layer includes a DUV light-absorbing oxide.

13. The method of claim 7, wherein the coating layer includes a spin-on-dielectric.

14. The method of claim 7, further comprising forming a source and a drain region on the semiconductor substrate.

15. The method of claim 7, wherein forming the coating layer on the metal layer includes the coating layer completely filling a remaining portion of the trench.

16. The method of claim 7, wherein forming the coating layer on the metal layer includes the coating layer completely covering the metal layer within the trench.

17. The method of claim 7, further comprising:
  after removing the unprotected portion of the metal layer, forming another coating layer on the metal layer such that a portion of the another coating layer protects another portion of the metal layer within the trench.

18. The method of claim 7, further comprising:
  after removing the portion of the coating layer from the trench, forming another coating layer on the metal layer such that a portion of the another coating layer protects another portion of the metal layer within the trench.

19. The method of claim 7, further comprising forming another coating layer on the metal layer such that a portion of the another coating layer protects another portion of the metal layer within the trench.

20. The method of claim 7, wherein after removing the unprotected portion of the metal layer a top surface of the metal layer remaining within the trench is below a top surface of the trench.

* * * * *